United States Patent
Shim

(10) Patent No.: US 6,337,256 B1
(45) Date of Patent: Jan. 8, 2002

(54) IMPURITY ION SEGREGATION PRECLUDING LAYER, FABRICATION METHOD THEREOF, ISOLATION STRUCTURE FOR SEMICONDUCTOR DEVICE USING THE IMPURITY ION SEGREGATION PRECLUDING LAYER AND FABRICATING METHOD THEREOF

(75) Inventor: Hyun Sook Shim, Cheongju (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/441,206

(22) Filed: Nov. 16, 1999

(30) Foreign Application Priority Data

May 10, 1999 (KR) .............................................. 99-16624

(51) Int. Cl.$^7$ .............................................. H01L 21/76

(52) U.S. Cl. ........................ 438/435; 438/424; 257/510

(58) Field of Search ................................ 438/424, 426, 438/435, 296; 257/510

(56) References Cited

U.S. PATENT DOCUMENTS

| | | | | |
|---|---|---|---|---|
| 4,571,819 A | * | 2/1986 | Rogers et al. | 438/424 |
| 5,447,884 A | * | 9/1995 | Fahey et al. | 438/424 |
| 5,780,346 A | * | 7/1998 | Arghavani et al. | 438/296 |
| 5,985,735 A | * | 11/1999 | Moon et al. | 438/435 |
| 6,051,478 A | * | 4/2000 | Ibok | 438/424 |
| 6,251,746 B1 | * | 6/2001 | Hong et al. | 438/424 |
| 6,255,194 B1 | * | 7/2001 | Hong | 438/435 |

FOREIGN PATENT DOCUMENTS

JP        2000-124303   *   4/2000  ........... H01L/21/76

OTHER PUBLICATIONS

Mazumder et al Improved Reliability of No Treated NH3–Nitrided Oxide with Regard to O2 Annealing Solid State Electronics vol. 42 No. 6 pp. 921–924 1998.*

T. S. Chao et al., "Mechanism of Nitrogen Coimplant for Suppressing Boron Penetration in $p^+$–polycrystalline Silicon Gate of p Metal–Oxide Semiconductor Field Effect Transistor", *Appl. Phys. Letters*, vol. 69, No. 12, Sep. 16, 1996, pp. 1781–1782.

Genshu Fuse et al., "A New Isolation Method with Boron–Implanted Sidewalls for Controlling Narrow–Width Effect", *IEEE Transactions On Electron Devices*, vol. ED–34, No. 2, Feb. 1987, pp. 356–360.

* cited by examiner

Primary Examiner—Charles Bowers
Assistant Examiner—David S Blum
(74) Attorney, Agent, or Firm—Morgan, Lewis & Bockius LLP

(57) ABSTRACT

The present invention relates to the impurity ion segregation precluding layer, the fabrication method thereof, the isolation structure for the semiconductor device using the segregation precluding layer and the fabrication method thereof, which are provided to prevent impurity ions from segregating into a device isolation region in a semiconductor substrate and eventually restrain decrease in a threshold voltage due to the segregation of impurity ion, particularly, boron ions in the semiconductor substrate. The isolation structure of the semiconductor device is fabricated by forming a trench in a portion of the semiconductor substrate; placing the semiconductor substrate into a high-temperature furnace; annealing the semiconductor substrate flowing a nitride gas at about 20 l/min into the furnace; and filling an insulator in the trench. Thus, an impurity ion segregation precluding film is formed on a surface of the trench at a thickness of 1–10A in the annealing process using the nitride gas, so that the decrease in the threshold voltage of the semiconductor device is restrained and thus the semiconductor device can stably operate.

10 Claims, 2 Drawing Sheets

IMPURITY ION SEGREGATION PRECLUDING LAYER, FABRICATION METHOD THEREOF, ISOLATION STRUCTURE FOR SEMICONDUCTOR DEVICE USING THE IMPURITY ION SEGREGATION PRECLUDING LAYER AND FABRICATING METHOD THEREOF

BACKGROUND OF THE INVENTION

1. Field of the Invention

The present invention relates to a semiconductor device, and more particularly to a layer for precluding segregation of impurity ions which prevents impurity ion permeation between a device isolation region and a semiconductor substrate, a fabrication method thereof, an isolation structure for a semiconductor device using the segregation precluding layer and a fabrication method thereof.

2. Description of the Conventional Art

A LOCOS (local oxidation of silicon) structure using a LOCOS method has been often used as an isolation structure of a conventional semiconductor device, but there is limit to improvement of integration of the semiconductor device due to generation of a bird's beaks thereof. Thus, there is a tendency to adopt an STI (shallow trench isolation) or PGI (profiled groove isolation) structure in which a trench or a groove is formed in a semiconductor substrate as a device isolation structure and then an insulator is filled therein.

FIG. 1 is a plan diagram illustrating a cell array unit of a semiconductor device, particularly, a DRAM (dynamic random access memory). A semiconductor substrate 100 is divided into an active region 101 and a non-active region 102 which covers the active region 101, the non-active region 102 being called a device isolation region. The active region is a part where a semiconductor device, that is, a transistor is formed and in which impurity ions are implanted, thus a source 101a and a drain 101b are provided. The device isolation region 102 electrically isolates the semiconductor device and has the STI or PGI structure. A gate electrode 104 is formed on the active region 101. A channel of the transistor is formed in a portion of the semiconductor substrate where the active region 101 and the gate electrode 104 are overlapped.

FIG. 2A is a cross-sectional vertical view taken along the line IIa—IIa of FIG. 1, the line horizontally crossing the active region 101 in a center point of a channel width of the transistor. As shown therein, the active region 101 of the semiconductor substrate 100 is covered by the device isolation region 102. The device isolation region 102 is etched to a predetermined depth (for example, about 0.5–0.8 mm), thereby forming a trench 102a and an insulator 102b is filled therein. The source 101a and the drain 101b, as shown in FIG. 1, are provided in the semiconductor substrate 100 having a predetermined distance and a gate insulating film 103 and a gate electrode 104 are formed on the semiconductor substrate 100.

While, FIG. 2B is a cross-sectional vertical view taken along the line IIb—IIb of FIG. 1, the line being perpendicular to the line IIa—IIa of FIG. 1. As shown therein, the trench or groove 102a is formed in the semiconductor substrate 100 and the insulator 102b is filled in the trench or groove 102a. Here, the part 102 in which the insulator is filled corresponds to the device isolation region. The gate insulating film 103 is formed on the semiconductor substrate 100 and a gate electrode 104 is formed thereon, the gate electrode 104 being formed in the active region 101 and extended to the upper surface of the device isolation region 102. 101c is a part where impurity ions in the semiconductor substrate segregate to the device isolation region and thus density thereof is considerably low. Also, 101d is a center part of the channel region of the transistor.

However, the conventional semiconductor device having the STI or PGI structure, particularly the semiconductor which is an N-channel transistor has problems as follows.

The N-channel transistor is generally formed in a p-type semiconductor substrate or in a p-type well. Impurity ions, in particular, boron ions in the p-type semiconductor substrate or the p-type wall have a tendency to easily segregate to the device isolation region and accordingly the density of the impurity ions of a portion adjacent to the device isolation region, that is, a portion 101c of the semiconductor substrate adjacent to a sidewall of the trench 102a becomes decreased. Accordingly, an impurity depletion layer is formed in the semiconductor substrate along the sidewall of the trench. As a result, in the center part 101d of the channel region the channel of the transistor is normally formed above a threshold voltage in accordance with a voltage applied to the gate electrode, but in the channel region adjacent to the device isolation region a channel is easily formed below the threshold voltage, so that the threshold voltage decreases. In addition, an electrical characteristic of the semiconductor device is unstable that, for example, a subthreshold current increases and a subthreshold current curve has a hump, which results in the deterioration of the semiconductor device.

SUMMARY OF THE INVENTION

Accordingly, the present invention is directed to an impurity ion segregation precluding layer, a fabrication method thereof, an isolation structure for semiconductor device using the impurity ion segregation precluding layer and a fabricating method thereof which obviate the problems and disadvantages in the conventional art.

An object of the present invention is to provide an impurity ion segregation precluding layer and a fabrication method thereof that prevent impurity ions in a semiconductor substrate from permeating into a device isolation region thereof.

Also, an object of the present invention is to provide an isolation structure of a semiconductor device and a fabrication method thereof that stabilize electric characteristics of a semiconductor device using the above impurity ion segregation precluding layer and thereby improve reliability thereof.

To achieve these and other advantages and in accordance with the purpose of the present invention, as embodied and broadly described herein, there is provided an impurity ion segregation precluding layer having a thickness of 1–10 A by placing a semiconductor substrate formed of silicon in a high-temperature furnace and annealing the semiconductor substrate while flowing a nitride gas thereinto at at least 20 l/min.

Also, to achieve the above objects of the present invention, there is provided an isolation structure of a semiconductor device, which includes a semiconductor substrate, a trench formed in a predetermined portion of the semiconductor substrate, an impurity ion segregation precluding layer formed on a surface of the trench, and an insulator filled in the trench, the impurity ion segregation precluding layer being obtained by placing the semiconductor substrate into a furnace at a high temperature and annealing the semiconductor substrate flowing a nitride gas into the furnace at about 20 l/min.

Also, to achieve the above objects of the present invention, there is provided a method for fabricating an isolation structure of a semiconductor device, which includes forming a trench in a portion of a semiconductor substrate formed of silicon corresponding to a device isolation region, placing the semiconductor substrate into a furnace at a high temperature and annealing the semiconductor substrate flowing a nitride gas into the furnace at about 20 l/min, and filling an insulator in the trench.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 1:
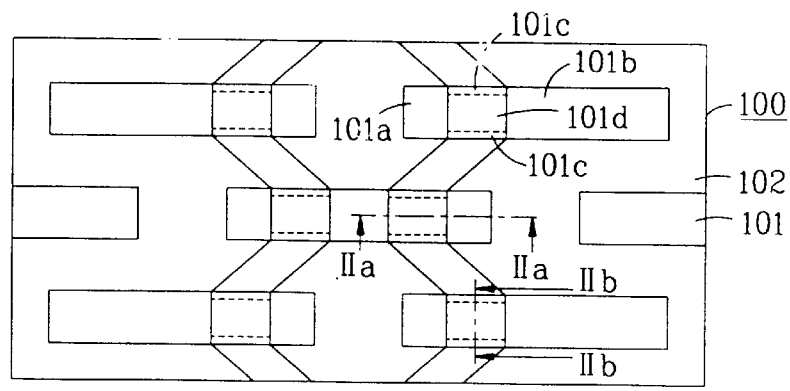
FIG. 1 is a plan diagram of a conventional DRAM cell array unit.
Figure 2A:
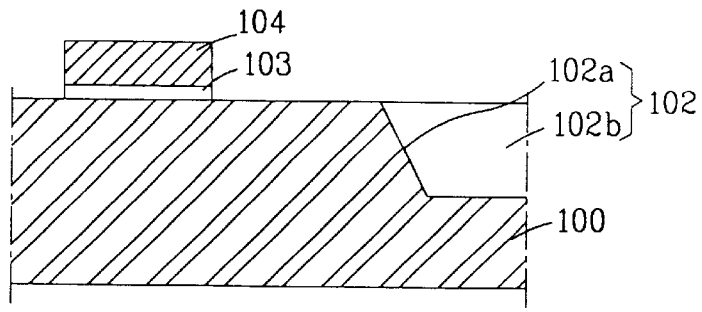
FIG. 2A is a cross-sectional vertical view taken along the line IIa—IIa of FIG. 1.
Figure 2B:
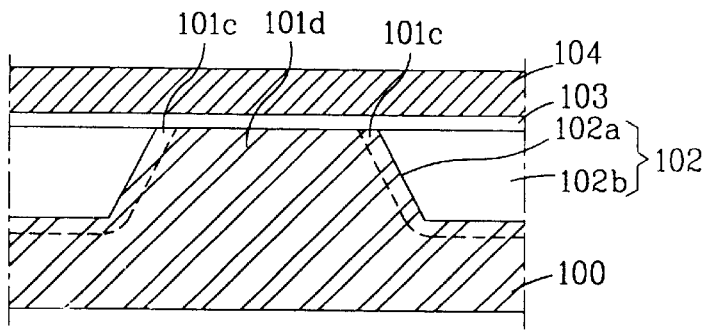
FIG. 2B is a cross-sectional vertical view taken along the line IIb—IIb of FIG. 1.
Figure 3:
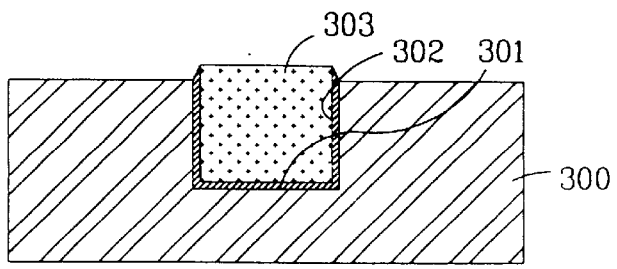
FIG. 3 is a cross-sectional vertical view of an isolation structure of a semiconductor device according to the present invention.

FIG. 3 is a cross-sectional vertical view illustrating an isolation structure of a semiconductor device using an insulating film according to the present invention.

As shown therein, a trench 301 is formed in a device isolation region in a semiconductor substrate 300 and an impurity ion segregation precluding layer 302 is formed on a surface of the semiconductor substrate 300 along a sidewall and a bottom of the trench 301, the impurity ion segregation precluding layer 302 having a thickness of about 1–9 A. An insulator 303 which is a silicon oxide $SiO_2$ or silicon nitride $Si_3N_4$ is filled in the trench 301. The impurity ion segregation precluding layer 302 at the thickness of 1–9 A formed along the sidewall and bottom of the trench 301 prevents the impurity ions in the semiconductor substrate 300 from permeating through the insulator 303 in the trench 301, thus preventing decrease in the impurity density of the semiconductor substrate. Accordingly, decrease in the threshold voltage in which a channel is formed below the threshold voltage is prevented and thus the reliability of the semiconductor device can improve.

The impurity ion segregation precluding layer 302 is obtained by putting the semiconductor substrate 300 having trench 301 in a high-temperature furnace (a furnace that is generally used in a semiconductor mass-production line) at about 800☐ C. and annealing the semiconductor substrate 300 while flowing nitride gas into the furnace at over 20 l/min. Since the semiconductor substrate 300 is silicon and the annealing process is applied with flowing the nitride gas, the impurity ion segregation precluding layer 302 formed on the bottom and sidewall of the trench 301 of the semiconductor substrate 300 is a silicon nitride which includes silicon and nitride atoms, respectively. In the silicon nitride, it is considered that a combination ratio of silicon to nitride is under 0.75 because of the large inflow of the nitride gas. That is, the silicon nitride has the most stable condition when three (3) silicon atoms are combined with four (4) nitride atoms such as $Si_3N_4$. However, according to the present invention, it is considered that the combination ratio of the silicon to the nitride is not 3:4, but the ratio of the nitride atom is higher than the silicon. Accordingly, the silicon nitride according to the present invention will be referred to a nitrogen-rich silicon nitride. However, such a nitrogen-rich silicon nitride can be $Si_3N_{4.1}$, $Si_3N_{4.2}$, $Si_3N_{4.3}$, $Si_3N_{4.4}$ . . . , or $Si_{2.9}N_4$, $Si_{2.8}N_4$, $Si_{2.7}N_4$, $Si_{2.6}N_4$, that is, when the silicon atom is 3, the nitride atom is at least 4, or when the nitride atom is 4, the silicon atom is less than 3. Also, the impurity ion segregation precluding layer is considerably thin, of which a thickness is less than 10 A. Since the thickness of the insulating film is less than 10 A, the insulating film is a single nitride atom layer. However, it has been observed through the experiment that the impurity ion segregation effect of this thin layer is excellent.

The thickness of the impurity ion segregation precluding layer according to the present invention is not a measured value but an estimated one, because "Telcor" of Telcor which the inventor used for measuring the film can only measure a film which has a thickness of at least 10 A. As a result of measuring the thickness of the impurity ion segregation precluding layer, it indicated 10 A, which is the lowest value that the instrument could measure. Thus, it is estimated that the thickness of the film is 10 A or less.

The reason that it is considered that the film exists, although the thickness of the film was not accurately measured by the instrument is as follows.

First, as described above, when forming the device isolation region by filling the insulator in the trench and then forming the transistor on the semiconductor substrate, after annealing the semiconductor substrate with the inflow the nitride gas at at least 20 l/min, decrease in the threshold voltage due to the impurity ion segregation of the semiconductor substrate was not shown. Accordingly, it can be assumed that there exists in the device isolation region a film that prevents the impurity permeation between the insulator and the semiconductor substrate.

Further, the following explains the reason why it is assumed that the impurity permeation preventing film is a silicon nitride.

After performing the annealing using the nitride gas, the inventor etched the semiconductor substrate with a BOE (buffered oxide etchant=buffered hydrofluorine), formed the device isolation region by filling the insulator in the trench and fabricated a transistor using the semiconductor substrate. Then, such a transistor had the same result as the semiconductor substrate before performing the BOE etching. Accordingly, it is estimated that the impurity permeation preventing film is not the silicon oxide, but there is provided a material of which nitride and silicon are combined, that is, the silicon nitride, since the silicon substrate was annealed using the nitride gas. Further, since the amount of the employed nitride gas is considerably larger than the nitride gas (6l /min at its maximum), which is used for the annealing process in the semiconductor device fabrication process, it is considered to be the nitrogen-rich silicon nitride.

While, the inventor additionally carried out the following experiment to evaluate the existence of the impurity ion segregation precluding layer and the characteristics thereof.

Table 1 illustrates results of the experiment that measured a thickness of an oxide formed on the semiconductor substrate when the semiconductor substrate was placed in the furnace at a temperature of at least about 800☐ C. and annealed in an oxygen atmosphere while flowing the nitride gas at 12 l/min and 20 l/min, respectively, thereinto. When the nitride gas was not flowed thereinto, the thickness of the oxide formed on the silicon substrate which was obtained under the same conditions in the oxygen atmosphere was 70 A. However, when the nitride gas was flowed into the furnace at 12 l/min and 20 l/min, respectively, and annealed in the oxygen atmosphere, the thickness of each oxide formed on the semiconductor substrate was less than 70 A. In other words, when the annealing process was performed in the oxygen atmosphere with the inflow of the nitride gas into the furnace at 12 l/min, the oxide formed on the silicon semiconductor substrate had a thickness of 66.8 A on average through experiments of three times, which had nearly the same result as the oxide formed on the semiconductor substrate without the nitride gas inflow into the furnace. Further, when the annealing process was performed in the oxygen atmosphere with the inflow of the nitride gas into the furnace at 20 l/min, the oxide formed on the silicon semiconductor substrate had a thickness of 36.6 A on average through experiments of three times, which has about half the thickness of the oxide formed on the semiconductor substrate without the nitride gas inflow into the furnace. Accordingly, it can be seen that when the nitride gas was flowed at least at 20 l/min during the annealing process, there is formed a film that prevents oxidization of a surface of the silicon semiconductor substrate.

Generally, it is known that an oxide is hardly formed on $Si_3N_4$, which is a stable silicon nitride. Thus, it can be assumed that growth of the oxide was restrained because there was formed the silicon nitride of which the nitride and the silicon were combined. In particular, the oxide grows, but the growth speed of the oxide was controlled while growing. Thus, it is considered that the silicon nitride has an unstable combination of a compound, not a stable one, and thus the inventor referred to the silicon nitride as the nitrogen-rich silicon nitride.

Further, as a result of the experiments, the oxide, formed on the semiconductor substrate when the nitride gas was flowed into the furnace at 12 l/min, has the thickness similar to the oxide which was formed without flowing the nitride gas into the furnace. Thus, it can be assumed that when the nitride gas is flowed at 12 l/min, the nitrogen-rich silicon nitride is not sufficiently formed on the semiconductor substrate, but when the annealing process is performed with the inflow of the nitride gas into the furnace at at least 20 l/min, there is formed on the surface of the trench the nitrogen-rich silicon nitride that has a desirable effect of precluding the impurity ion segregation. However, considering the fabrication cost, it is preferred to perform the annealing process with the inflow of the nitride gas into the furnace at 20 to 50 l/min.

TABLE 1

| | | | Experiment (time) | | | |
|---|---|---|---|---|---|---|
| | | | 1 | 2 | 3 | average |
| Nitride (l) | 12 | thickness of oxide(A) | 66.9 | 66.5 | 67.0 | 66.8 |
| | 20 | | 39.3 | 31.2 | 39.3 | 36.6 |

Next, a fabrication method of the semiconductor device isolation structure of FIG. 3 according to the present invention will be described with the reference to FIGS. 4A to 4E.

Figure 4A:
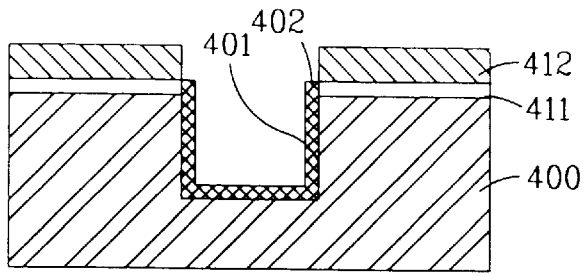
FIGS. 4A through 4E are cross-sectional vertical views illustrating a fabrication method of an isolation structure of a semiconductor device according to the present invention.

First, as shown in FIG. 4A, a trench 401 is formed in a part of a semiconductor substrate 400 corresponding to a device isolation region. The trench 401 is formed by the following process. First, a pad oxide 411 is formed over the semiconductor substrate 400. The pad oxide 411 can be formed by oxidizing a silicon substrate by a thermal oxidization method or deposited by a chemical vapor deposition method. A silicon nitride 412 is deposited on the pad oxide 411, and a photoresist film (not shown) is applied on the silicon nitride 412 and a photolithography process is performed, so that the photoresist film remains on the silicon nitride 412, which corresponds to an active region, which becomes a photoresist film pattern (not shown). Using the photoresist film pattern as a mask, the silicon nitride 412 and the pad oxide 411 are etched by a reactive ion etching method and then the semiconductor substrate 400 formed under the etched pad oxide 411 is etched to a predetermined depth, thereby forming the trench 401. Further, to recover a surface of the semiconductor substrate 400 which has been damaged in the etching process to form the trench 401, the semiconductor substrate is annealed at 1050☐ C. in an $O_2$ atmosphere, so that there is formed a thermal oxide 402 at a thickness of about 50–200 A on the semiconductor substrate 400 in the trench 401.

Figure 4B:
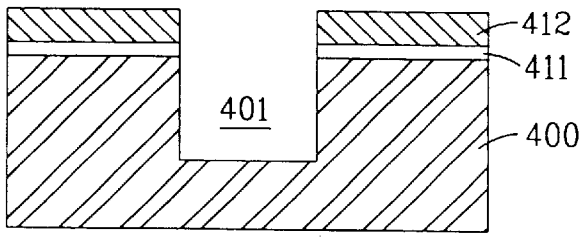

As shown in FIG. 4B, the thermal oxide 402 is removed using an HF solution.

Figure 4C:
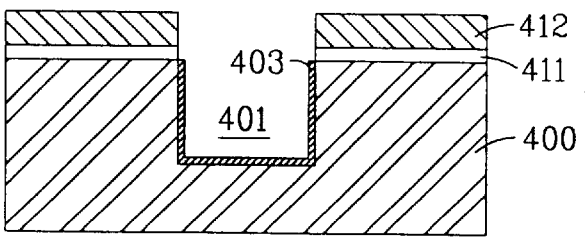

Next, as shown in FIG. 4C, the semiconductor substrate of FIG. 4b is placed in a furnace at a temperature of at least 800☐ C. and annealed while flowing a nitride gas $N_2$ into the furnace at 20–50 l/min, thereby forming an impurity ion segregation precluding layer 403 at a thickness of 1–10 A on the semiconductor substrate 400 along an inner wall and a bottom of the trench 401. Here, the impurity ion segregation precluding layer 403 is the nitrogen-rich silicon nitride which has been above described. Also, a nitride ion implantation method can be performed as a method for forming the nitrogen-rich silicon nitride on the semiconductor substrate, however since such an ion implantation method damages the surface of the semiconductor substrate, it is not recommendable. Specifically, when a portion of the semiconductor substrate adjacent to the device isolation region is damaged, a leakage current may be generated, thus it is more desirable to perform the annealing process in the nitride atmosphere, rather than the ion implantation method.

Figure 4D:
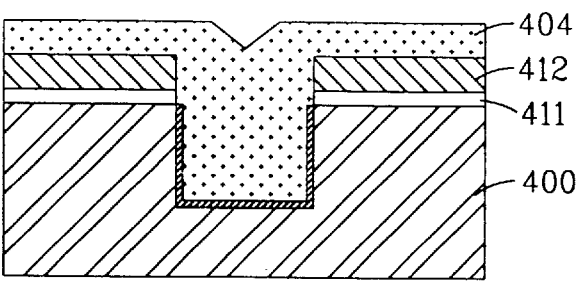

As shown in FIG. 4D, an insulator 404 is formed on an entire surface of the resultant structure of FIG. 4C including the trench 401 and an annealing process is performed to the resultant structure. Here, the insulator is preferably a silicon oxide or silicon nitride. Then, a chemical mechanical polishing process is performed to the insulator 404 for thereby removing a portion of the insulator formed on the silicon nitride 412, so that a surface level of the resultant semiconductor substrate 400 becomes planarized.

Figure 4E:
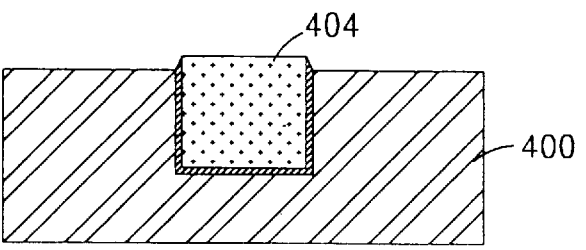

Next, as shown in FIG. 4E, the silicon nitride 412 and the pad oxide 411 are sequentially removed, thereby completing the fabrication of the isolation structure of the semiconductor device.

As described above, the thin impurity ion segregation precluding layer, that is, the nitrogen-rich silicon nitride at a thickness of several A is formed on the surface of the part of the semiconductor substrate corresponding to the device isolation region, thereby preventing the inter-permeation of the impurity ions between the device isolation region and the semiconductor substrate, which has an effect of improving the reliability of semiconductor device by stabilizing the electric characteristics of the device.

It will be apparent to those skilled in the art that various modifications and variations can be made in the impurity ion segregation precluding layer, the fabrication method thereof, the isolation structure for the semiconductor device using the segregation precluding layer and the fabrication method thereof of the present invention without departing from the spirit or scope of the invention. Thus, it is intended that the present invention cover the modifications and variations of this invention provided they come within the scope of the appended claims and their equivalents.

What is claimed is:

1. A method of fabricating an impurity ion segregation precluding layer, comprising the steps of:

forming a trench in a predetermined portion of a silicon substrate; and forming an impurity ion segregation precluding layer, made of a nitrogen-rich silicon nitride $Si_xN_y$ (x/y<0.75), on a surface of the trench by placing the silicon substrate in a furnace at a high temperature and annealing the silicon substrate with a nitride gas flow of about 20 l/min.

2. The method according to claim 1, wherein the annealing process is performed in the furnace at about 800□ C.

3. The method according to claim 1, wherein the annealing process is performed to form a nitrogen-rich silicon nitride having a thickness of 10 A or less.

4. A method of fabricating an isolation structure of a semiconductor device, comprising the steps of:

forming a trench in a portion of a semiconductor substrate corresponding to a device isolation region;

forming an impurity ion segregation precluding layer, made of a nitrogen-rich silicon nitride $Si_xN_y$ (x/y<0.75), having a thickness of 10 A or less on a surface of the trench; and filling an insulator in the trench.

5. A method of fabricating an isolation structure of a semiconductor device, comprising the steps of:

preparing a semiconductor substrate;

forming a trench in a portion of the semiconductor substrate corresponding to a device isolation region;

placing the semiconductor substrate into a furnace at a high temperature;

forming an impurity ion segregation precluding layer, made of a nitrogen-rich silicon nitride $Si_xN_y$ (x/y<0.75), on a surface of the trench by annealing the semiconductor substrate with a nitride gas flow of about 20 l/min; and filling an insulator in the trench.

6. The method according to claim 5, wherein the annealing process is performed to form an impurity ion segregation precluding layer having a thickness of 10 A or less on a sidewall and a bottom surface of the trench of the semiconductor substrate.

7. The method according to claim 6, wherein the impurity ion segregation precluding layer is a nitrogen-rich silicon nitride.

8. The method according to claim 5, further comprising the steps of:

after forming the trench, annealing the semiconductor substrate at a temperature of 1000–1050□ C. in an oxygen atmosphere, for thereby forming a thermal oxide on the surface of the trench, the thermal oxide having a thickness of 50–200 A; and removing the thermal oxide with an HF solution.

9. The method according to claim 5, wherein the step of filling the insulator in the trench includes:

forming an insulating film over an entire surface of the semiconductor substrate which is obtained from the annealing process; and planarizing the insulating film by a chemical mechanical polishing method, so that the insulating film only remains in the trench.

10. The method according to claim 5, wherein the step of forming the trench includes:

forming a pad oxide on the semiconductor substrate, forming a silicon nitride on the pad oxide;

forming a photoresist pattern on a portion of the silicon nitride corresponding to an active region; and removing the silicon nitride and the pad oxide by using the photoresist pattern as a mask and etching the semiconductor substrate formed under the removed pad oxide to a predetermined depth.

* * * * *